United States Patent [19]

Bass

[11] Patent Number: 5,455,532
[45] Date of Patent: Oct. 3, 1995

[54] 3V TO 5V RECEIVER/TRANSLATOR USING A 5V SUPPLY AND A 3V REFERENCE

[75] Inventor: Alan S. Bass, Plano, Tex.

[73] Assignee: Texas Instruments Incorporated, Dallas, Tex.

[21] Appl. No.: 50,934

[22] Filed: Apr. 21, 1993

[51] Int. Cl.$^6$ .............. H03K 19/0175; H03K 19/0185
[52] U.S. Cl. .................. 327/306; 327/319; 326/63; 326/68; 326/80; 326/81
[58] Field of Search ....................... 307/475, 570, 307/544, 552, 558, 584, 264; 326/61, 63, 64, 68, 75, 80, 81, 83, 84; 327/306, 307, 389, 318, 319

[56] References Cited

U.S. PATENT DOCUMENTS

| | | | |
|---|---|---|---|
| 4,988,897 | 1/1991 | Jeong | 307/475 |
| 5,087,841 | 2/1992 | Rogers | 307/475 |
| 5,144,167 | 9/1992 | McClintock | 307/475 |

Primary Examiner—Timothy P. Callahan
Assistant Examiner—L. Lam
Attorney, Agent, or Firm—Ronald O. Neerings; James C. Kesterson; Richard L. Donaldson

[57] ABSTRACT

A circuit that translates one voltage level to another voltage level. In one embodiment of the invention, an input buffer translates a 3 volt level to a 5 volt level. Such an input buffer facilitates communications between 3 volt I/Os and 5 volt core logic and memories. And while the input buffer is described as being ideal for communications between 3 volt I/Os and 5 volt core logic and memories of a gate array, the translator circuitry of the invention can be used in a wide variety of electronic devices where a chip operating on 5 volts must interface with a 3 volt system.

18 Claims, 3 Drawing Sheets

5,455,532

3V TO 5V RECEIVER/TRANSLATOR USING A 5V SUPPLY AND A 3V REFERENCE

FIELD OF THE INVENTION

The present invention relates to the field of integrated circuit devices and, more particularly, to an input buffer that translates a 3 volt level to a 5 volt level.

BACKGROUND OF THE INVENTION

Logic circuitry typically encountered in electronic devices operates on 5 volts. The past few years have seen the emergence of 3 volt logic designs in an attempt to reduce the power consumed by logic circuitry. The result is a need for circuits which interface between 3 volts and 5 volts.

SUMMARY OF THE INVENTION

The present invention disclosed herein comprises a circuit that translates one voltage level to another voltage level. In one embodiment of the invention, an input buffer translates a 3 volt level to a 5 volt level. Such an input buffer facilitates communications between 3 volt I/Os and 5 volt core logic and memories. And while the input buffer is described as being ideal for communications between 3 volt I/Os and 5 volt core logic and memories of a gate array, the translator circuitry of the invention can be used in a wide variety of electronic devices where a chip operating on 5 volts has to interface with a 3 volt system.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawing, wherein:

DETAILED DESCRIPTION OF THE INVENTION

Many existing gate arrays have 5 volt power pins and 5 volt power busses, but no provision for a 3 volt supply. As 3 volt logic becomes more common, it becomes necessary to have circuits which interface between 3 volt and 5 volt logic. As an example, there is a need for 3 volt I/Os which communicate with 5 volt core logic and memories.

Figure 1:
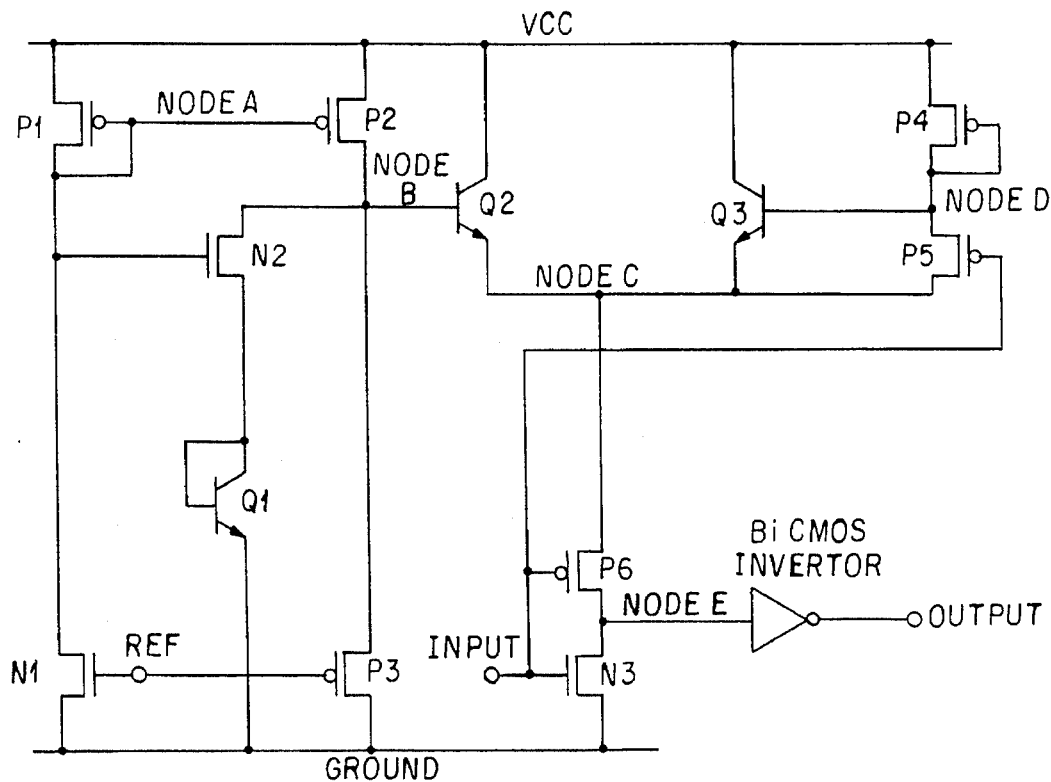
FIG. 1 is a schematic diagram of a receiver/translator circuit according to a preferred embodiment of the invention.

FIG. 1 is a schematic diagram of a receiver/translator circuit according to a preferred embodiment of the invention. The source of p-channel transistor P1, the source of p-channel transistor P2, the collector of transistor Q2, the collector of transistor Q3 and the source of p-channel transistor P4 are connected to VCC. The drain of transistor P1 is connected to the gates of transistors P1 and P2, to the gate of n-channel transistor N2 and to the drain of n-channel transistor N1.

The drain of transistor P2 is connected to the drain of transistor N2, to the source of p-channel transistor P3 and to the base of transistor Q2. The emitter of transistor Q2 is connected to the source of p-channel transistor P6, to the emitter of transistor Q3 and to the drain of p-channel transistor P5. The base of transistor Q3 is connected to the gate and the drain of transistor P4 and to the source of transistor P5. The gate of transistor P5 is connected to an input terminal INPUT and to the gates of transistor P6 and n-channel transistor N3.

The drain of transistor P6 and the drain of transistor N3 are connected to an input of a BiCMOS inverter. The output of the BiCMOS invertor is connected to an output terminal OUTPUT. The gate of transistor N1 is connected to a terminal for receiving a reference voltage REF and the gate of transistor P3 is connected to a terminal for receiving the reference voltage REF. The source of transistor N1, the drain of transistor P3 and the source of transistor N3 are connected to ground.

An input signal received by the INPUT terminal feeds a CMOS inverter formed by transistors P6 and N3. This invertor is tied between NODE C and GROUND. When the input signal is held near its threshold value, both P6 and N3 are on, and their current is supplied by Q2 under nominal conditions. When Q2 is on, NODE C will typically be about 3.6 V (assuming a 3.0 volt reference is applied). Device sizes for P6 and N3 are chosen so that the invertor has a 1.5 volt threshold when NODE C is 3.6 volts (1.5 volts is ½ of the 3 volt reference, which is the desired threshold). It is desirable to make NODE C greater than the reference voltage so that NODE E, which drives a 5 volt circuit, will have a high level greater than 3 volts.

NODE B is set up to track with the reference voltage and to be independent of the 5 volt supply, VCC. The reference voltage comes into the gate of P3, so NODE B is a gate-source voltage higher than the reference voltage, or about 1.4 volts above the reference. NODE C is one VBE lower than NODE B, so NODE C is approximately REF+1.4−0.8=REF+0.6.

If the reference voltage at the gate of P3 increases, the voltage at NODE B must increase by the same amount. When NODE B increases, there is less source-drain voltage across P2, which causes less current to flow through P2 (and therefore less current through P3), which reduces the gate-source voltage of P3. In order to prevent this from happening, the reference voltage is also fed into the gate of N1, which serves as a current source feeding P1. As the reference voltage increases on the gate of N1, more current flows through N1 and P1, forcing NODE A lower, which increases the current through P2. This increase through P2 cancels out the decrease caused by the reduced source-drain voltage across P2. Keeping a nearly constant current through P2 helps maintain a more constant current through P3, which helps keep the gate-source voltage across P3 nearly constant. Therefore, NODE B tracks with the reference voltage.

If the VCC voltage increases, there will be more source-drain voltage across P2, which will cause more current to flow through P2. This increased current will cause the voltage on NODE B to rise, which is undesirable. However, as VCC rises, the voltage on NODE A also rises, which causes more current to flow through N2. This extra current in N2 draws off the extra current from P2, so the current through P3 remains nearly constant. As a result, the gate-source voltage across P3 remains nearly constant. The voltage on NODE B does not change as VCC changes.

Transistor Q1 makes the input threshold more temperature independent. As temperature increases, VBE voltages shrink, so there is a larger gate-source voltage across N2 at higher temperatures, which results in N2 drawing more current. This extra current forces NODE B lower; however, since the VBE of Q2 also shrinks at high temperatures, NODE C remains constant over the temperature changes.

Transistors P4, P5 and Q3 insure that the BiCMOS inverter output low level approaches ground under all conditions. Full switching of the invertor is guaranteed only if NODE E, and therefore NODE C, can go high enough. P5 is a very small p-channel device, so it cannot supply enough current to significantly change the voltage at NODE C when the input is near threshold. Therefore, P5 has very little effect on the input threshold. However, after the input goes low, the invertor (P6 and N3) pulls no current, so P5 can pull NODE C (and thereby NODE E) up to the same voltage as NODE D. Moreover, since P4 prevents NODE D from going any lower than a VT below VCC, the input to the BiCMOS inverter will always go high enough to insure a good low level at the output.

Under one extreme condition, when VCC=5.5 volts and REF=2.7 volts, the voltage at NODE C will be low enough that the initial switching of the input inverter (P6 and N3) will not insure adequate switching of the BiCMOS invertor. Q3 keeps NODE C slightly higher under this condition (Q3 remains off under other conditions), which takes care of this potential problem.

The receiver/translator circuit of the present invention can be used to facilitate communication between 3 volt I/Os and 5 volt core logic and memories of gate arrays and other electronic devices. 3 volts is introduced through a signal pin and acts only as a reference voltage for setting the input threshold and output levels. The circuit receives a CMOS signal from a part with supply voltage between 2.7 volts and 3.6 volts. The circuit has reference input driven by the low voltage supply, and its threshold is equal to approximately ½ of that low voltage. Thus, the BiCMOS inverter produces a full 5 volt signal swing with excellent drive capability for driving a signal into the core of a gate array.

Figure 2:
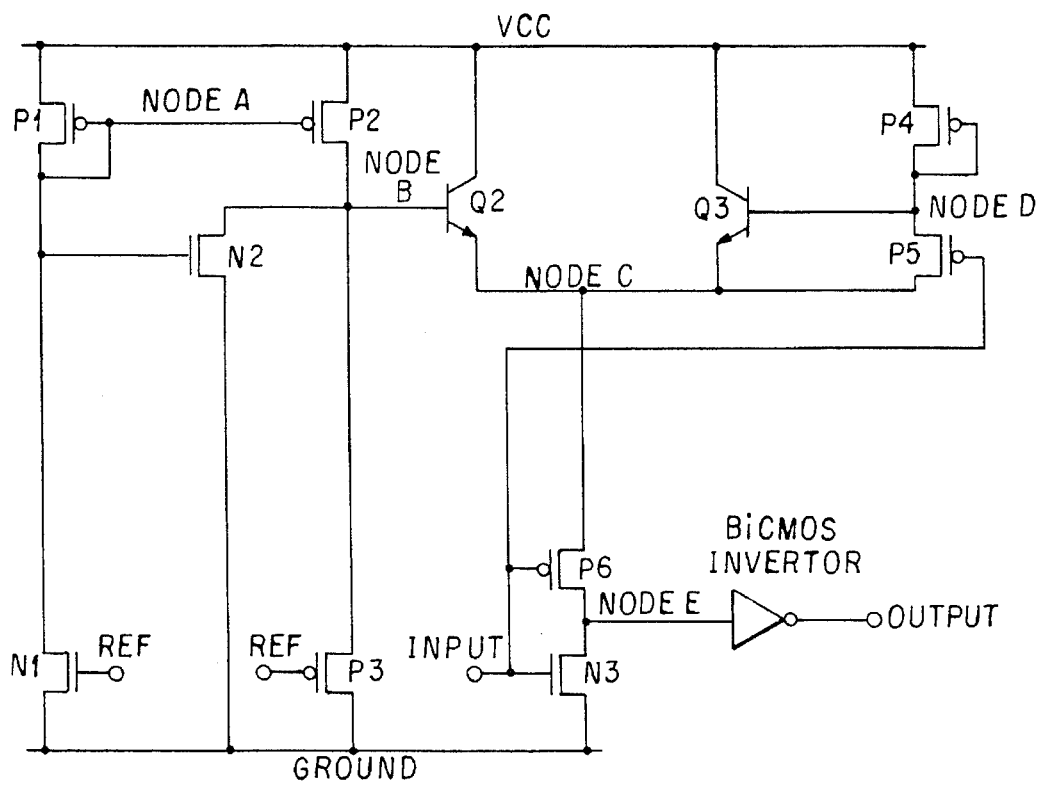
FIG. 2 is a schematic diagram of a receiver/translator circuit according to another embodiment of the invention.

FIG. 2 is a schematic diagram of a receiver/translator circuit according to another embodiment of the invention. FIG. 2 is the circuit of FIG. 1 without transistor Q1. The circuit of FIG. 2 is not as temperature independent as the circuit of FIG. 1. As temperatures increase, VBE voltages shrink, so there is a larger gate-source voltage across N2 at higher temperatures, which makes N2 draw more current. The extra current forces NODE B lower resulting in a voltage change on NODE C.

Figure 3:
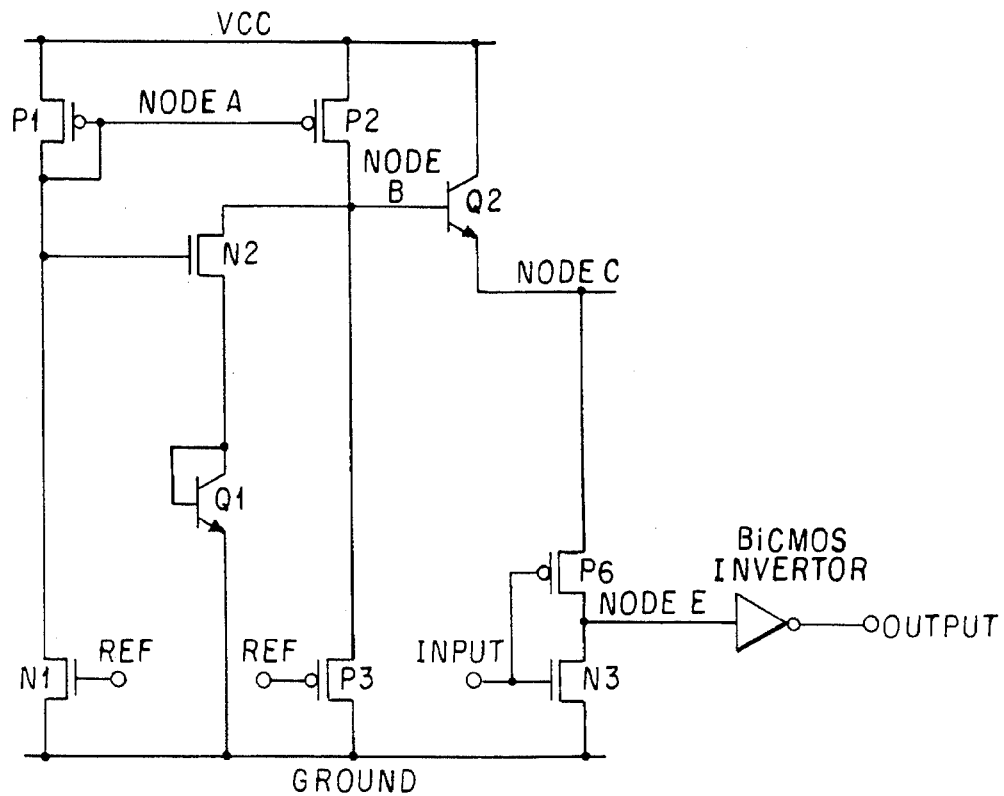
FIG. 3 is a schematic diagram of a receiver/translator circuit according to yet another embodiment of the invention.

FIG. 3 is a schematic diagram of a receiver/translator circuit according to yet another embodiment of the invention. FIG. 3 is the circuit of FIG. 1 without transistors P4, P5 and Q3. But the circuit of FIG. 3 cannot insure that the BiCMOS invertor output low level will reach ground or close thereto under all conditions.

Figure 4:
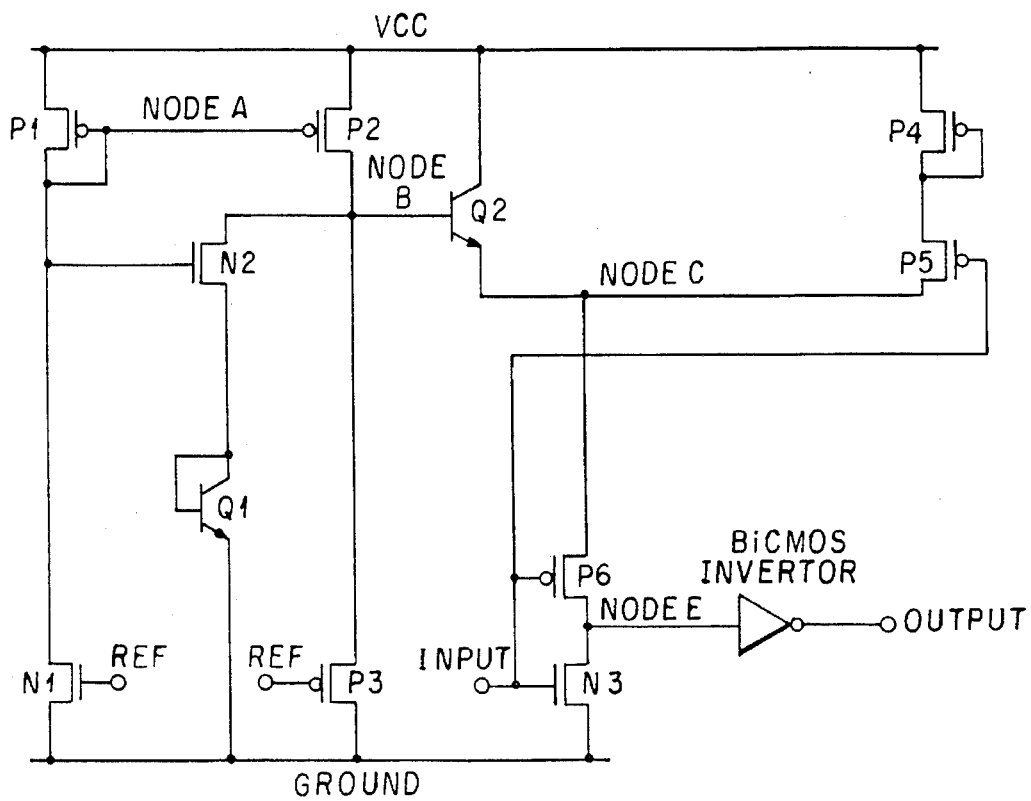
FIG. 4 is a schematic diagram of a receiver/translator circuit according to still yet another embodiment of the invention.

FIG. 4 is a schematic diagram of a receiver/translator circuit according to still yet another embodiment of the invention. FIG. 4 is the circuit of FIG. 1 without transistor Q3. The absence of Q3 is missed under one extreme condition, when VCC=5.5 volts and REF=2.7 volts. Under this condition, the voltage at NODE C can be low enough that the initial switching of the input invertor (P6 and N3) will not insure adequate switching of the BiCMOS invertor.

Figure 5:
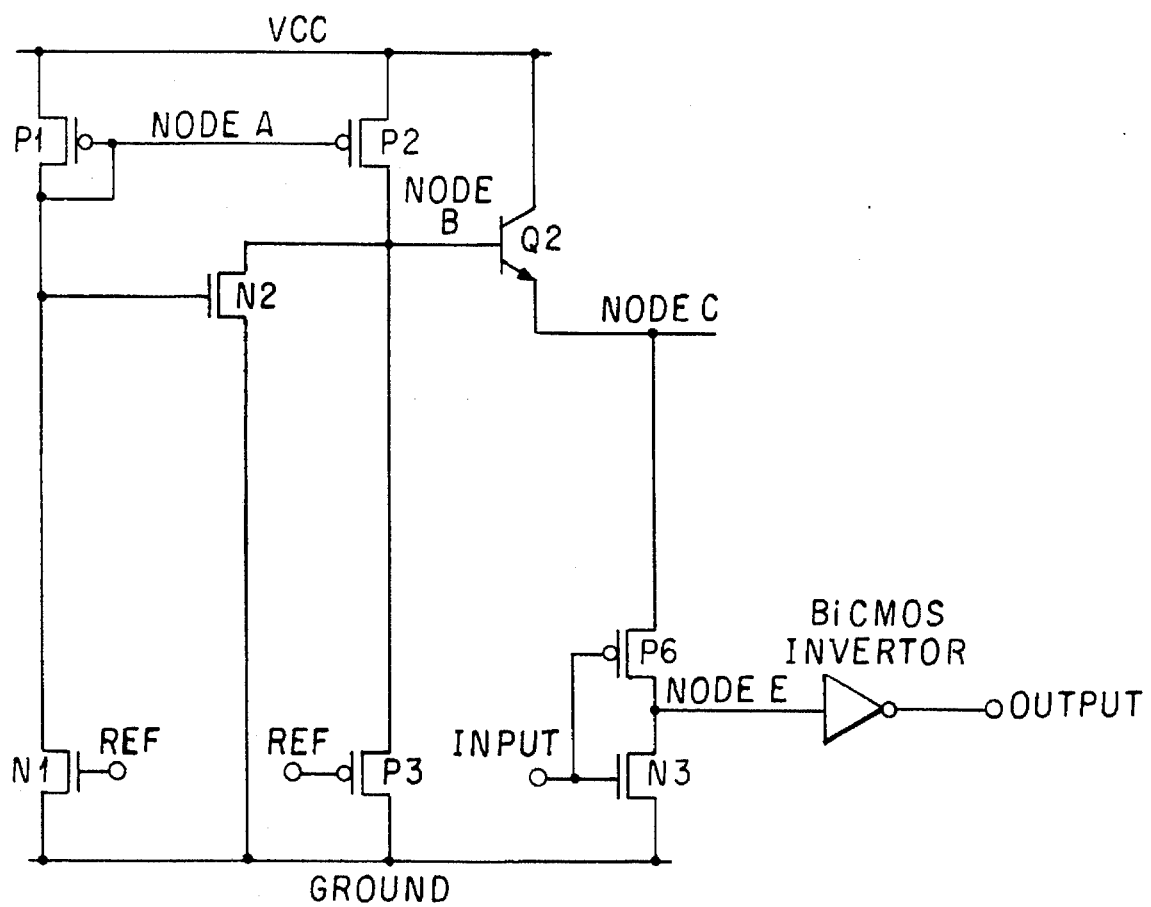
FIG. 5 is a schematic diagram of a receiver/translator circuit according to still another embodiment of the invention.

FIG. 5 is a schematic diagram of a receiver/translator circuit according to still another embodiment of the invention. FIG. 5 is the circuit of FIG. 1 without transistors Q1, P4, P5 and Q3. The circuit of FIG. 5 is not as temperature independent as the circuit of FIG. 1, as is the case with the circuit of FIG. 2, and cannot insure that the BiCMOS invertor output low level will reach ground or close thereto under all conditions, as is the case with the circuit of FIG. 3.

While this invention has been described with reference to illustrative embodiments, this description is not to be construed in a limiting sense. Various modifications to the illustrative embodiments, as well as other embodiments of the invention will be apparent to persons skilled in the art upon reference to this description. As an example, it is well known that transistor types, e.g., FET, Bipolar, etc, can be interchanged. It is therefore contemplated that the appended claims will cover any such modifications or embodiments as fall within the true scope of the invention.

What is claimed

1. A device, comprising:

an input terminal;

a control electrode of a first transistor and a control electrode of a second transistor connected to said input terminal, a first electrode of said first transistor and a first electrode of said second transistor connected to an input of an inverter, an output terminal of said inverter connected to an output terminal;

a third transistor having a first electrode connected to a second electrode of said first transistor, a second electrode connected to a supply voltage and a control electrode connected to first electrodes of a fourth, a fifth and a sixth transistor;

a second electrode of said fourth transistor and a first electrode of a seventh transistor connected to said supply voltage, a control electrode of said fourth transistor connected to a control electrode of said seventh transistor, to a second electrode of said seventh transistor, to a control electrode of said sixth transistor and to a first electrode of an eighth transistor;

second electrodes of said second, fifth, sixth and eighth transistors connected to ground, a control electrode of said fifth transistor and a control electrode of said eighth transistor coupled to receive a reference voltage.

2. The device of claim 1 in which said inverter is a BiCMOS inverter.

3. The device of claim 1 in which said first and second transistors form an inverter.

4. The device of claim 1 in which said first transistor is a p-channel FET and said second transistor is an n-channel FET.

5. The device of claim 1 further including:

a ninth transistor having a first electrode connected to the supply voltage, a control electrode and a second electrode connected to a first electrode of a tenth transistor, a second electrode of said tenth transistor connected to said second electrode of said first transistor, and a control electrode of said tenth transistor connected to said input terminal; and an eleventh transistor coupling said sixth transistor to ground, a first electrode and a control electrode of said eleventh transistor connected to said second electrode of said sixth transistor, and a second electrode of said eleventh transistor connected to ground.

6. The device of claim 5 further including a twelfth transistor having a first electrode connected to said supply voltage, a control electrode connected to said first electrode of said tenth transistor, and a second electrode connected to said second electrode of said first transistor.

7. The device of claim 1 further including a ninth transistor coupling said sixth transistor to ground, a first electrode and a control electrode of said ninth transistor connected to said second electrode of said sixth transistor, and a second electrode of said ninth transistor connected to ground.

8. The device of claim 1 further including:

a ninth transistor having a first electrode connected to the supply voltage, a control electrode and a second electrode connected to a first electrode of a tenth transistor, a second electrode of said tenth transistor connected to said second electrode of said first transistor, and a control electrode of said tenth transistor connected to said input terminal;

an eleventh transistor having a first electrode connected to said supply voltage, a control electrode connected to said first electrode of said tenth transistor, and a second electrode connected to said second electrode of said first transistor; and a twelfth transistor coupling said sixth transistor to ground, a first electrode and a control electrode of said twelfth transistor connected to said second electrode of said sixth transistor, and a second electrode of said twelfth transistor connected to ground.

9. The device of claim 1 in which said supply voltage is VCC.

10. The device of claim 1 in which said third transistor is a bipolar transistor, said fourth, fifth and seventh transistors are p-channel FETs and said sixth and eighth transistors are n-channel FETs.

11. The device of claim 5 in which said ninth and tenth transistors are p-channel FETs and said eleventh transistor is bipolar.

12. The device of claim 6 in which said twelfth transistor is bipolar.

13. The device of claim 7 in which said ninth transistor is bipolar.

14. The device of claim 8 in which said ninth and tenth transistors are p-channel FETs, said eleventh and twelfth transistors are bipolar.

15. An input buffer that translates a 3 volt level to a 5 volt level, comprising:

an input terminal and an output terminal;

a control electrode of a first transistor and a control electrode of a second transistor connected to said input terminal, a first electrode of said first transistor and a first electrode of said second transistor connected to an input of an inverter, an output terminal of said inverter connected to an output terminal;

a third transistor having a first electrode connected to a second electrode of said first transistor, a second electrode connected to a supply voltage and a control electrode connected to first electrodes of a fourth, a fifth and a sixth transistor;

a second electrode of said fourth transistor and a first electrode of a seventh transistor connected to said supply voltage, a control electrode of said fourth transistor connected to a control electrode of said seventh transistor, to a second electrode of said seventh transistor, to a control electrode of said sixth transistor and to a first electrode of an eighth transistor;

second electrodes of said second, fifth and eighth transistors connected to ground, a control electrode of said fifth transistor and a control electrode of said eighth transistor coupled to receive a reference voltage; and a ninth transistor having a first electrode and a control electrode connected to said second electrode of said sixth transistor and a second electrode connected to ground.

16. The input buffer of claim 15 further including:

a tenth transistor having a first electrode connected to the supply voltage, a control electrode and a second electrode connected to a first electrode of an eleventh transistor, a second electrode of said eleventh transistor connected to said second electrode of said first transistor, and a control electrode of said eleventh transistor connected to said input terminal; and a twelfth transistor having a first electrode connected to said supply voltage, a control electrode connected to said first electrode of said eleventh transistor, and a second electrode connected to said second electrode of said first transistor.

17. A method, comprising:

providing an input terminal;

providing first and second transistors, a control electrode of said first transistor and a control electrode of said second transistor connected to said input terminal, a first electrode of said first transistor and a first electrode of said second transistor connected to an input of an inverter, an output terminal of said inverter connected to an output terminal;

providing third, fourth, fifth, sixth and seventh transistors, a first electrode of said third transistor connected to a second electrode of said first transistor, a second electrode connected to a supply voltage and a control electrode connected to first electrodes of a fourth, a fifth and a sixth transistor, a second electrode of said fourth transistor and a first electrode of a seventh transistor connected to said supply voltage, a control electrode of said fourth transistor connected to a control electrode of said seventh transistor, to a second electrode of said seventh transistor, to a control electrode of said sixth transistor and to a first electrode of an eighth transistor; and second electrodes of said second, fifth, sixth and eighth transistors connected to ground, a control electrode of said fifth transistor and a control electrode of said eighth transistor coupled to receive a reference voltage.

18. The method of claim 17, further including:

providing a ninth transistor and a tenth transistor, a first electrode of said ninth transistor connected to the supply voltage, a control electrode and a second electrode connected to a first electrode of said tenth transistor, a second electrode of said tenth transistor connected to said second electrode of said first transistor, and a control electrode of said tenth transistor connected to said input terminal;

providing an eleventh transistor, a first electrode of said eleventh transistor connected to said supply voltage, a control electrode connected to said second electrode of said tenth transistor, and a second electrode connected to said second electrode of said first transistor; and providing a twelfth transistor coupling said sixth transistor to ground, a first electrode and a control electrode of said twelfth transistor connected to said second electrode of said sixth transistor, and a second electrode of said twelfth transistor connected to ground.

* * * * *